United States Patent
Tanamachi

(10) Patent No.: US 8,036,848 B2
(45) Date of Patent: Oct. 11, 2011

(54) SEMICONDUCTOR WAFER TESTING APPARATUS AND METHOD OF TESTING SEMICONDUCTOR WAFER

(75) Inventor: Takahiro Tanamachi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 1013 days.

(21) Appl. No.: 11/700,766

(22) Filed: Feb. 1, 2007

(65) Prior Publication Data

US 2007/0176621 A1  Aug. 2, 2007

(30) Foreign Application Priority Data

Feb. 2, 2006  (JP) .................. 2006-026085
Jan. 19, 2007  (JP) .................. 2007-009823

(51) Int. Cl.
*G01R 27/28* (2006.01)
(52) U.S. Cl. .................................... 702/120
(58) Field of Classification Search .......... 702/57–59, 702/64–65, 117–120, 179; 324/537, 763–765, 324/555; 438/14, 17, 18
See application file for complete search history.

(56) References Cited

U.S. PATENT DOCUMENTS

| | | | | |
|---|---|---|---|---|
| 5,534,786 | A * | 7/1996 | Kaneko et al. | 324/760 |
| 6,646,461 | B2 * | 11/2003 | Sugiura et al. | 324/765 |
| 7,351,597 | B2 * | 4/2008 | Wada et al. | 438/14 |
| 2004/0054951 | A1 * | 3/2004 | Ma et al. | 714/735 |

FOREIGN PATENT DOCUMENTS

| | | |
|---|---|---|
| JP | 7-37959 | 2/1995 |
| JP | 2003-332189 | 11/2003 |
| JP | 2004-266017 | 9/2004 |

* cited by examiner

*Primary Examiner* — Aditya Bhat

(74) *Attorney, Agent, or Firm* — Young & Thompson

(57) ABSTRACT

In a method of testing a semiconductor wafer, semiconductor chips of a predetermined number are selected from among a plurality of semiconductor chips formed on a semiconductor wafer, and a first test is performed on I/O pins of each of the selected semiconductor chips. Then, a second test is performed on a part of the I/O pins of each of non-selected semiconductor chips as ones of the plurality of semiconductor chips other than the selected semiconductor chips.

5 Claims, 9 Drawing Sheets

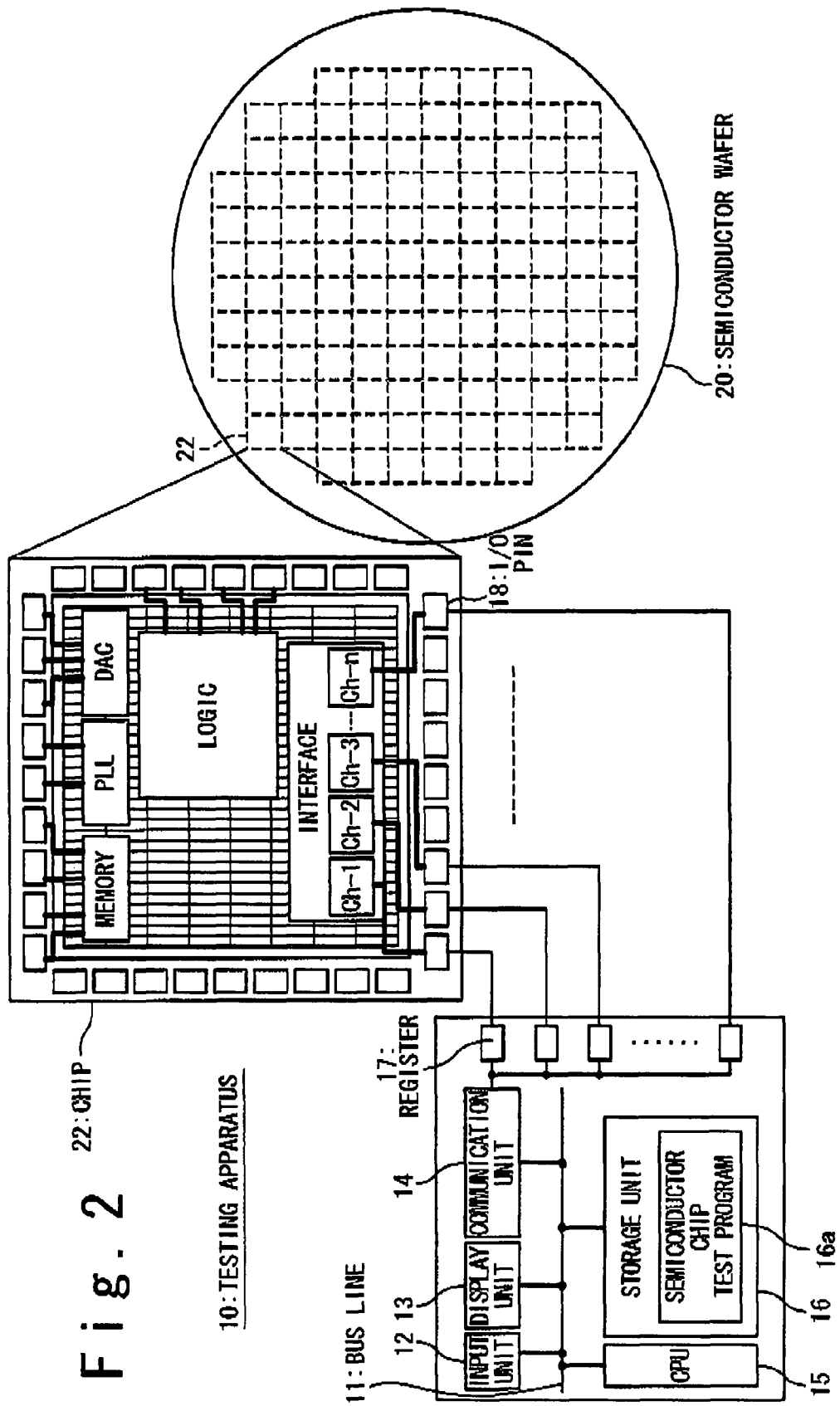

SEMICONDUCTOR WAFER TESTING APPARATUS AND METHOD OF TESTING SEMICONDUCTOR WAFER

BACKGROUND OF THE INVENTION

1. Field of the Invention

The present invention relates to a semiconductor wafer testing apparatus and a testing method of a semiconductor wafer.

2. Description of the Related Art

In a test of a semiconductor device by using a conventional semiconductor wafer testing apparatus, the whole of one semiconductor wafer is divided into n (n is a natural number larger than 1) regions, and m (m is a natural number smaller than n) regions are optionally selected from among the n regions. Then, a test of necessary test items is performed to semiconductor chips for the semiconductor devices formed on the m selected regions. All the test items are not necessary to semiconductor chips formed in the remaining (n−m) regions, and a test of selected test items is performed based on a cumulative defect percentage calculated from the test result to each of the semiconductor chips formed on the m regions. Thus, each test item having the cumulative defect percentage equal to or smaller than a specified threshold value is omitted to shorten the overall test time.

FIGS. 1A and 1B show a process flow of a test performed on a semiconductor wafer by a conventional semiconductor wafer testing apparatus. Upon start of the test of the semiconductor wafer, all test items (test item 1 to 5) are determined as necessary test items and a test of the test items is performed on m regions selected from n regions of a semiconductor wafer (step S1). Then, the determination of good product/defective product is carried out for each of the m regions based on the test result. Next, the number of defects and a cumulative defect percentage are determined for the semiconductor chips of a same type based on the test result carried out at the step S1 (step S2). At a time when the test of the necessary test items on the selected m regions is completed, a test of the necessary test items and a test of the selected test items are performed on the semiconductor chips formed on the (n−m) non-selected regions (step S3). In an examples shown in FIGS. 1A and 1B, the test item 1 and 2 are necessary test item, and the test items 3 to 5 are the selected test items. For the semiconductor chips formed on the (n−m) regions, the test of the necessary test items, i.e., a test of the test item 1 (step S4) and a test of the test item 2 (step S5) are first performed. A test of the selected test items is performed on the semiconductor chips, which passed the test of the necessary test items, and the semiconductor chips, which did not pass the test of the necessary test items, are handled as defective products.

When a test of the selected test item 3 starts, the cumulative defect percentage for the test item 3 is first checked (step S6). Here, if the cumulative defect percentage is 0.2% or more, the test of the test item 3 is actually performed (step S7). On the other hand, if the cumulative defect percentage is not larger than 0.2%, it is checked whether or not each of semiconductor chips formed on the m regions is defective (step S8). Here, if any of the semiconductor chips is defective, the test of the test item 3 is performed (step S7). If any of the semiconductor chips is not defective, the test of the test item 3 is omitted, and the semiconductor chips formed on the (n−m) regions pass the test of the test item 3 and are transferred as good products to the test of the next selected test item 4.

Operations in the test of the test items 4 and 5 are the same as that in the test of the test item 3, and thus the detailed description thereof is omitted here. When the test of the selected test items 3 to 5 is completed, products that have passed all the test items are handled as good products (step S15). On the other hand, if the products which have been determined to be defective in any one of the test items are handled as the detective products (step S16). When it is confirmed that the test of all the test items on all the semiconductor chips formed on the (n−m) regions has been completed (step S17), the cumulative defect percentages are obtained based on the test result of the test items 1 to (step S18), thus completing the test of the test items 1 to 5.

As described above, in order to incorporate the selected test items into the test by the conventional semiconductor wafer testing apparatus for omitting the test items, it is necessary that a chip manufacturing variation dependent on the region in the semiconductor wafer is small. For example, there is a case that process parameters such as a film thickness and dimension for physical evaluation and management concerning the chip structure and electrical parameters such as a threshold voltage of a transistor, an ON current value, an electrical resistance value of a resistor, and a capacitance of a capacitor are different depending on the location of the semiconductor chips. Alternately, there is a case that the process parameters and electrical parameters are different due to any manufacture-related trouble.

In such a case, if the test item is omitted based on the cumulative defect percentage for the test item, deterioration in the chip quality at shipment is caused.

In conjunction with the above description, Japanese laid Open Patent application (JP-P2004-266017A) discloses a "semiconductor wafer testing method", in which the whole region of a semiconductor wafer is previously divided into n regions and a test is performed on each of the regions, m (n>m) regions of the n regions are optionally set and the test of necessary test items and selected test items is performed on the m regions. Good product/defective product determination is performed based on the test result and a test of the necessary test items is performed on the (n−m) regions and a test of the selected test items is performed in accordance with the cumulative defect percentages of the selected test items, and the final good product/defective product determination is performed based on the test result.

Also, Japanese Laid Open Patent application (JP-P2003-332189A) discloses a "semiconductor test system". In this conventional example, a semiconductor wafer testing apparatus performs a test of a plurality of test items on semiconductor chips formed on a semiconductor wafer based on a test program. A management apparatus manages the test program used by this semiconductor wafer testing apparatus. The semiconductor wafer testing apparatus and the management apparatus are connected to each other through a communication line network. In the management apparatus, a collecting section collects test results of the plurality of test items on the semiconductor chips. A determining section determines the test items that can be omitted for all the semiconductor chips or the semiconductor chips satisfying a predetermined condition, based on the test result collected by the collecting section. A test program generating section generates a test program to omit the test items that have been determined by the determining section for all the semiconductor chips or semiconductor chips satisfying the predetermined condition. A transmitting section transmits the test program generated by the test program generating section to the semiconductor wafer testing apparatus. The semiconductor wafer testing apparatus performs the test in accordance with the test program transmitted from the transmitting section.

Moreover, Japanese Laid Open Patent application (JP-A-Heisei, 7-37959) discloses a "wafer test method". In this conventional testing method of a wafer having a plurality of chips, a test of all test items is performed for a part of chips on a wafer whose arrangement position has been selected. A test of only the test items selected based on a test result is performed for the remaining chips on the wafer.

In accompaniment with the recent trend of a semiconductor device toward higher performance such as a multi-pin structure and a higher operation speed, a time required for a test of the semiconductor device has become longer. Thus, it is important to reduce the test time of the semiconductor wafer for semiconductor devices so as to improve a production efficiency and to reduce a cost of the semiconductor device. In order to reduce the test time, there is a case that some of test items are omitted. However, when the test items are simply omitted, deterioration in quality of the semiconductor wafer for the semiconductor devices is caused.

SUMMARY OF THE INVENTION

In an aspect of the present invention, a method of testing a semiconductor wafer, is achieved by selecting semiconductor chips of a predetermined number from among a plurality of semiconductor chips formed on a semiconductor wafer; by performing a first test on I/O pins of each of the selected semiconductor chips; and by performing a second test on a part of the I/O pins of each of non-selected semiconductor chips as ones of the plurality of semiconductor chips other than the selected semiconductor chips.

Here, the performing a first test may be achieved by performing the first test of test items on the I/O pins of each of the selected semiconductor chips, and the performing a second test may be achieved by performing the second test of the test items on the part of the I/O pins of each of the non-selected semiconductor chips.

The semiconductor wafer may be divided into n (n is a natural number more than 1) regions, and the plurality semiconductor chips may be formed in the n regions. The selecting may be achieved by selecting m (m is a natural number smaller than n) regions from the n regions; and by selecting semiconductor chips from each of the selected m regions as the semiconductor chips of the predetermined number.

Also, the selecting may be achieved by selecting m (m is a natural number smaller than n) regions from the n regions; and by selecting J (J is a natural number) semiconductor chips from the selected m regions as the semiconductor chips of the predetermined number.

Also, the J semiconductor chips may be in a range of 0.1 to 0.3 of the plurality of semiconductor chips.

Also, the method may be achieved by further calculating a cumulative defect percentage for each of the test items of the first test. The performing a second test may be achieved by performing the second test on the part of the I/O pins for each of the non-selected semiconductor chips when the cumulative percentage is not higher than a preset defect percentage.

In another aspect of the present invention, a semiconductor wafer testing apparatus which tests semiconductor chips formed in regions of a semiconductor wafer, includes a CPU; a storage unit configured to store a semiconductor chip test program; and a communication unit configured to receive and hold a data signal sent from each of the semiconductor chips. The CPU reads out and executes the semiconductor chip test program from the storage unit. The CPU, based on the semiconductor chip, test program: selects semiconductor chips of an optionally set number from a plurality of semiconductor chips formed in regions into which the semiconductor wafer is divided, performs a first test of test items on I/O pins of each of the selected semiconductor chips, acquires data signals for the test items through the communication unit to store in the storage unit, performs a second test of selected ones of the test items on at least one sampled from the I/O pins of each of non-selected semiconductor chips as ones of the plurality of semiconductor chips other than the selected semiconductor chips, and the test items contains necessary test items and the selected test items.

Also, in still another aspect of the present invention, a semiconductor wafer testing apparatus which tests semiconductor chips formed in regions of a semiconductor wafer, includes a CPU; a storage unit configured to store a semiconductor chip test program; and a communication unit configured to receive and hold a data signal sent from each of the semiconductor chips. The CPU reads out and executes the semiconductor chip test program from the storage unit. The CPU, based on the semiconductor chip test program: selects semiconductor chips of an optionally set number from a plurality of semiconductor chips formed in regions into which the semiconductor wafer is divided, performs a first test of test items on each of the selected semiconductor chips, performs a second test of necessary ones of the test items on each of non-selected semiconductor chips as ones of the plurality of semiconductor chips other than the selected semiconductor chips, the test items containing the necessary test items and selected test items, compares a cumulative defect percentage of each of the selected test items with a preset defect percentage, determines whether a third test of the selected test item should be performed on each of the non-selected semiconductor chips, based on the comparing result, when the cumulative defect percentage of the selected test item is higher than the preset defect percentage, performs the third test of the test item on each of the non-selected semiconductor chips, when the cumulative defect percentage of the selected test item is not higher than the preset defect percentage, calculates a pin defect percentage for each of I/O pins of each of the non-selected semiconductor chips, selects test omissible I/O pins of each of the non-selected semiconductor chips based on the pin defect percentage, performs the third test of the selected test items on a remaining I/O pin as at least one of the I/O pins other than the test omissible I/O pins in each of the non-selected semiconductor chips, and updates the cumulative defect percentage for each of the selected test items and for the remaining I/O pin.

Also, the optionally set number of the semiconductor devices may be 10 to 30% of the plurality of semiconductor chips. Also, the preset defect percentage may be 0.1%.

In another aspect of the present invention, a semiconductor wafer testing apparatus includes a CPU; a storage unit configured to store a semiconductor chip test program; and a communication unit configured to receive a data signal from each of I/O pins of each of semiconductor chips. The CPU reads out and executes the semiconductor chip test program from the storage unit. The CPU, based on the semiconductor chip test program, selects semiconductor chips from a plurality of semiconductor chips formed on a semiconductor wafer, the communication unit receives the data signal from each of the I/O pins in each of the selected semiconductor chips and a part of the I/O pins in each of non-selected semiconductor chips as ones of the plurality of semiconductor chips other than the selected semiconductor chips, and the CPU performs, based on the data signals, a first test on the I/O pins in each of the selected semiconductor chips and the part of the I/O pins in each of the non-selected semiconductor chips.

Here, the CPU may perform the first test of test items on the I/O pins in each of the selected semiconductor chips and the part of the I/O pins in each of the non-selected semiconductor chips.

Also, the semiconductor wafer may be divided into N (N is a natural number larger than 1) regions on which the plurality of semiconductor chips are formed. The CPU may select M (M is a natural number smaller than N) regions from the N regions and select J semiconductor chips in each of the M regions. The number of semiconductor chips in each region may be J.

Also, the semiconductor wafer may be divided into N (N is a natural number larger than defect 1) regions on which the plurality of semiconductor chips are formed, The CPU may select M (M is a natural number smaller than N) region from the N regions and select J semiconductor chips in each of the M regions. The number of semiconductor chips selected from each region may be smaller than J.

The value J*M may be set to be in a range of 10 to 30% of the number of the plurality of semiconductor chips.

The semiconductor wafer testing apparatus may further include a storage unit configured to store a cumulative defect percentage for every test item. When a cumulative defect percentage is not higher than a preset defect percentage, the CPU may perform a test of the test item on a part of the I/O pins in each of the non-selected semiconductor chips.

In another aspect of the present invention, a method of testing a semiconductor wafer, is achieved by selecting semiconductor chips of a predetermined number from a plurality of semiconductor chips formed in a plurality of regions of a semiconductor wafer; by performing a first test of test items on all of I/O pins of each of the selected semiconductor chips; and by performing a second test of selected ones of the test items on at least one I/O pin in each of non-selected semiconductor chips as ones of the plurality of semiconductor chips other than the selected semiconductor chips based on a result of the first test.

In an aspect of the present invention, a method of testing a semiconductor wafer is achieved by selecting semiconductor chips of a predetermined number from a plurality of semiconductor chips formed in a plurality of regions of a semiconductor wafer; by performing a first test of test items on each of the selected semiconductor chips; by performing a second test of necessary ones among the test items on each of non-selected semiconductor chips as ones of the plurality of semiconductor chips other than the selected semiconductor chips, wherein the test items are grouped into the necessary test items and selected test items; by comparing a cumulative defect percentage for each of selected test items as ones of the test items other than the necessary test items and a preset defect percentage to determine whether a third test of the selected test items should be performed on each of the non-selected semiconductor chips; by performing the third test of each of the selected test items on each of the non-selected semiconductor chips when the cumulative defect percentage for the selected test item is higher than the preset defect percentage; by calculating a defect percentage for each of I/O pins of each of the non-selected semiconductor chips when the cumulative defect percentage for the selected test item is not higher than the preset defect percentage; by determining test omissible ones of the I/O pines of each of the non-selected semiconductor chips based on the calculated detect percentages; and by performing the third test of the selected test item on ones of the I/O pins other than the test omissible I/O pins in each of the non-selected semiconductor chips.

Here, the semiconductor chips of a predetermined number are preferably in a range of 10 to 30% of the plurality of semiconductor chips. Also, the preset defect percentage may be 0.1%.

The present invention can provide a semiconductor wafer testing apparatus and a semiconductor device testing method, in which the test time of a semiconductor device as the test subject can be reduced and deterioration in the quality at shipment thereof can be prevented.

BRIEF DESCRIPTION OF THE DRAWINGS

FIG. 2 is a diagram schematically showing the configuration of a semiconductor wafer testing apparatus according to the first embodiment of the present invention;

DESCRIPTION OF THE PREFERRED EMBODIMENTS

Figure 1A:
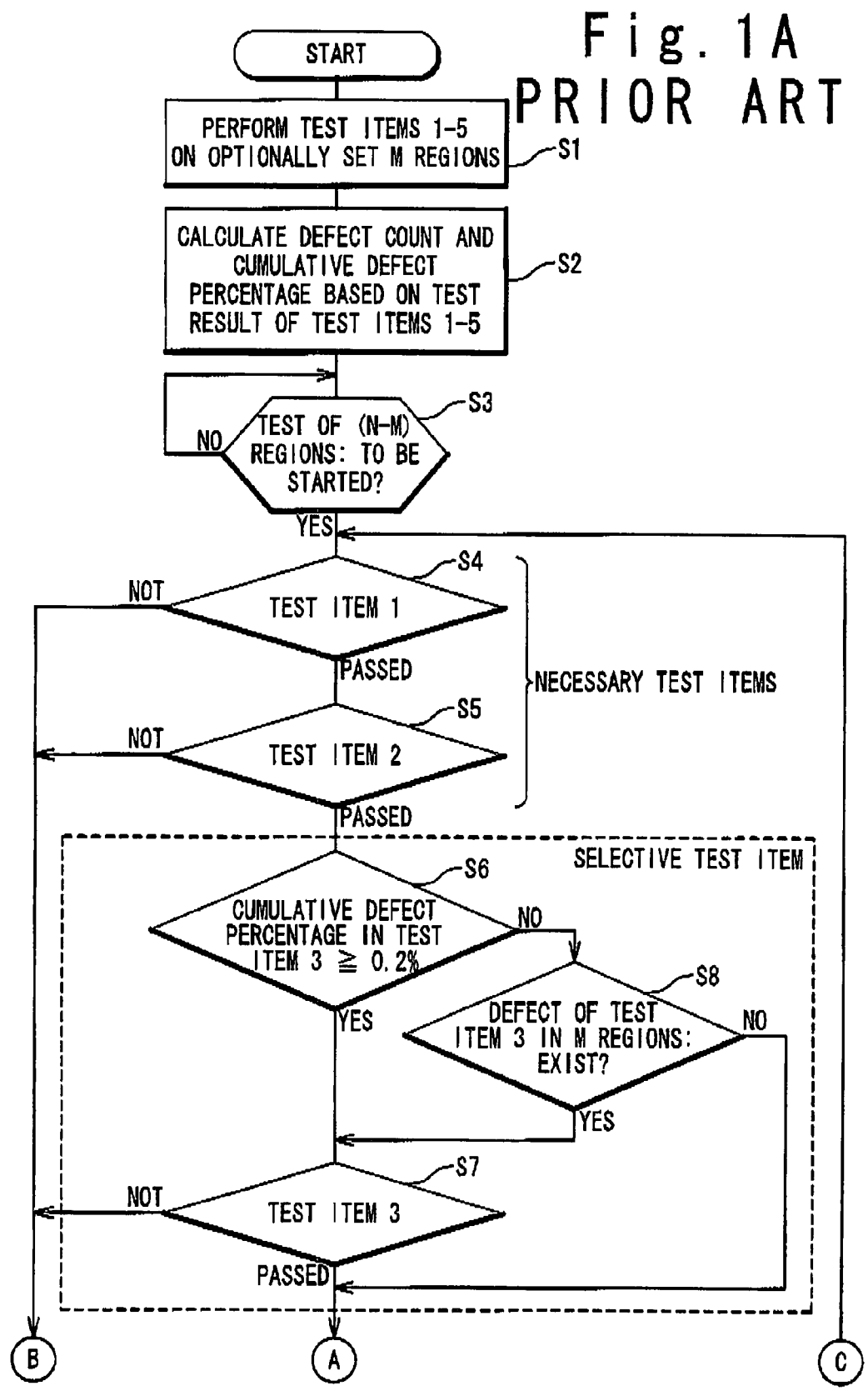
FIGS. 1A and 1B are diagrams showing a control flow of a conventional semiconductor wafer testing method.
Figure 1B:
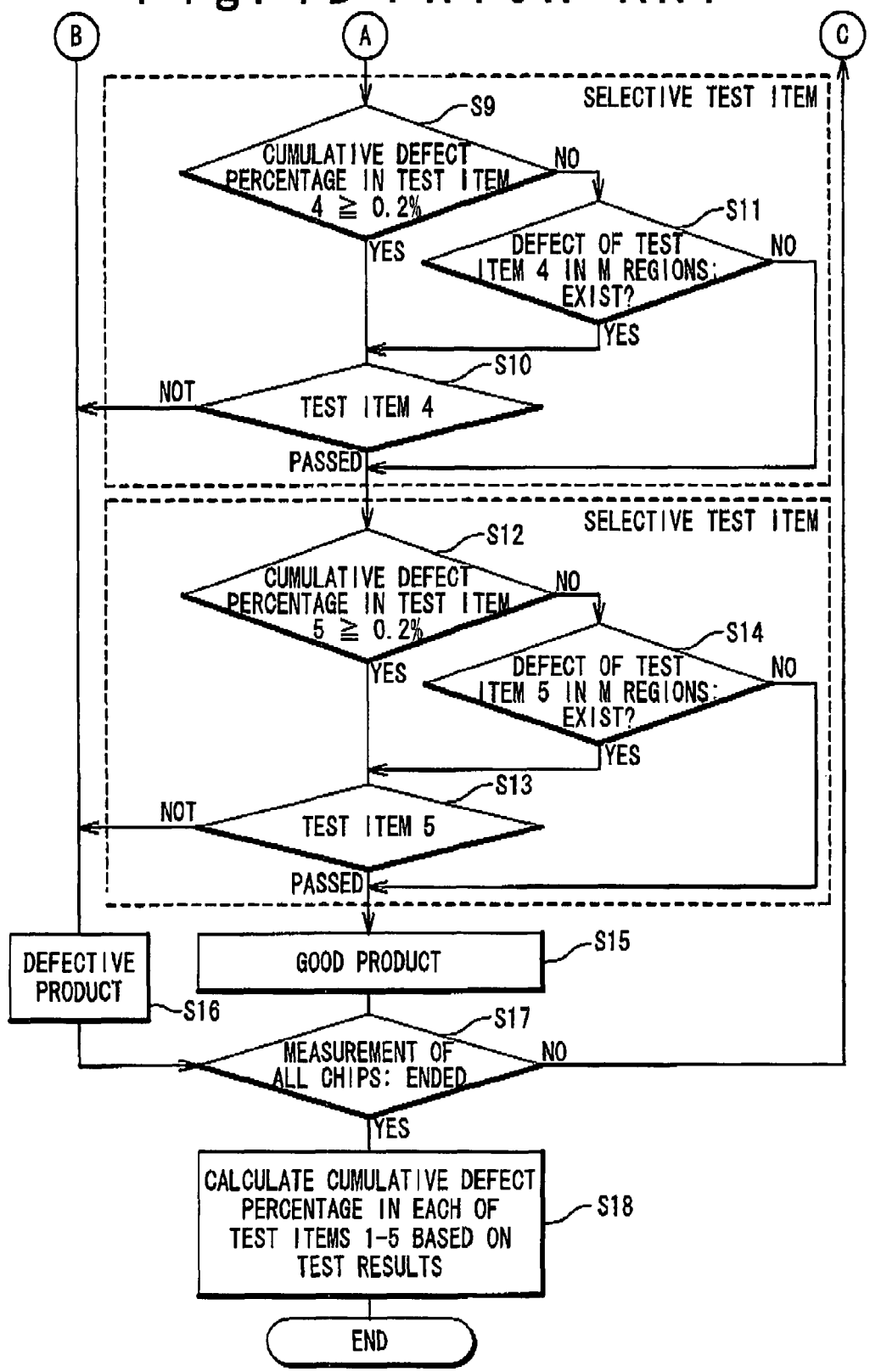

Hereinafter, a semiconductor wafer testing apparatus and a semiconductor wafer testing method according to the present invention will be described with reference to the attached drawings.

First Embodiment

FIG. 2 is a diagram schematically showing the configuration of the semiconductor wafer testing apparatus according to the first embodiment of the present invention. The semiconductor wafer testing apparatus 10 according to the first embodiment includes a CPU 15, a storage unit 16, and input unit 12 for inputting instructions; a display unit 13 for displaying test results of a semiconductor chip 22; a communication unit 14; and registers 17 for temporarily holding input signals from respective I/O (INPUT/OUTPUT) pins 18 of the semiconductor chip as the test subject. The units 12 to 16 are connected with a bus line 11. Here, the I/O pin is a signal pin located inside the semiconductor chip, and is used for the input and output of a signal to and from the chip inside. This I/O pin 18 is electrically connected through a wiring to elements such as a transistor, a resistor, and a capacitance, which are provided inside the semiconductor chip and to circuits composed of elements such as an interface section, a logic section, a memory section, a PLL (Phase-locked loop) section, and a DAC (digital-to-analog converter). Moreover, in the storage unit 16, a semiconductor chip test program 16a is stored, which is provided for performing a test of each of the semiconductor chips 22 which are cut out from a semiconductor wafer 20 whose region is previously divided into a plurality of regions.

In the first embodiment, a data signal indicating a test result transmitted from the respective I/O pins 18 of the semiconductor chip 22 are temporarily stored in the registers 17 for every semiconductor device or for the semiconductor wafer and then stored into the storage unit 16. In an alternatively embodiment, the data signal may be directly stored into the storage unit 16 without passing through the registers 17.

In a semiconductor device testing method performed by the semiconductor wafer testing apparatus 10 according to the first embodiment, a whole region of the semiconductor wafer 20 is divided into a plurality of regions, in which a plurality of semiconductor devices are formed, and semiconductor chips formed in an optionally predetermined number of regions are selected. Then, a test of all test items as necessary test items is performed on each of the selected semiconductor chips. When the test of all the test items on S (S is a natural number) I/O pins in each of the selected semiconductor chips ends, a defect percentage for each test item and for each I/O pin is calculated. When the calculated defect percentage to a specific one of the test items is equal to or smaller than a predetermined threshold value over all the S I/O pins, the test of the specific test item as a selected test item is performed on not all the I/O pins but a predetermined number T (T is a natural number to meet T<S) of the I/O pins. The threshold value is preferably about 0.1%, and this value is determined under consideration of cost when a defect is detected in a subsequent step, although a screening test is performed after a package assembly. The predetermined number T of the I/O pins is 10% of the total I/O pins or a number of I/O pins calculated by a statistical method. Here, the statistical method is a method, in which a current value, a voltage value, and the like are monitored upon the test on the I/O pins, and a variation in each value and a standard deviation are calculated. When it is determined that there is a sufficient margin for a standard value (determination criteria are previously provided), the number of I/O pins to be tested is reduced. Moreover, the statistical method is a method, in which the number of I/O pins to be tested is increased or a sampling test is stopped when products having values very close to a reference pass the test and are determined to be good products.

It is generally known that a manufacture variation of I/O pins provided in one semiconductor device is small. In the first embodiment, through adoption of the selected test items, it can be avoided that all the I/O pins of all the semiconductor chips are subjected to a test of necessary test items, thereby achieving improvement in efficiency in semiconductor chip production. On the other hand, in the present invention, the test of the selected test items is performed on at least one of all the I/O pins of at least one of all the semiconductor chips formed on all of the plurality of regions of the semiconductor wafer. As a result, compared to a case where all the test items are eliminated, deterioration in quality of the semiconductor chips can be suppressed.

Figure 3A:
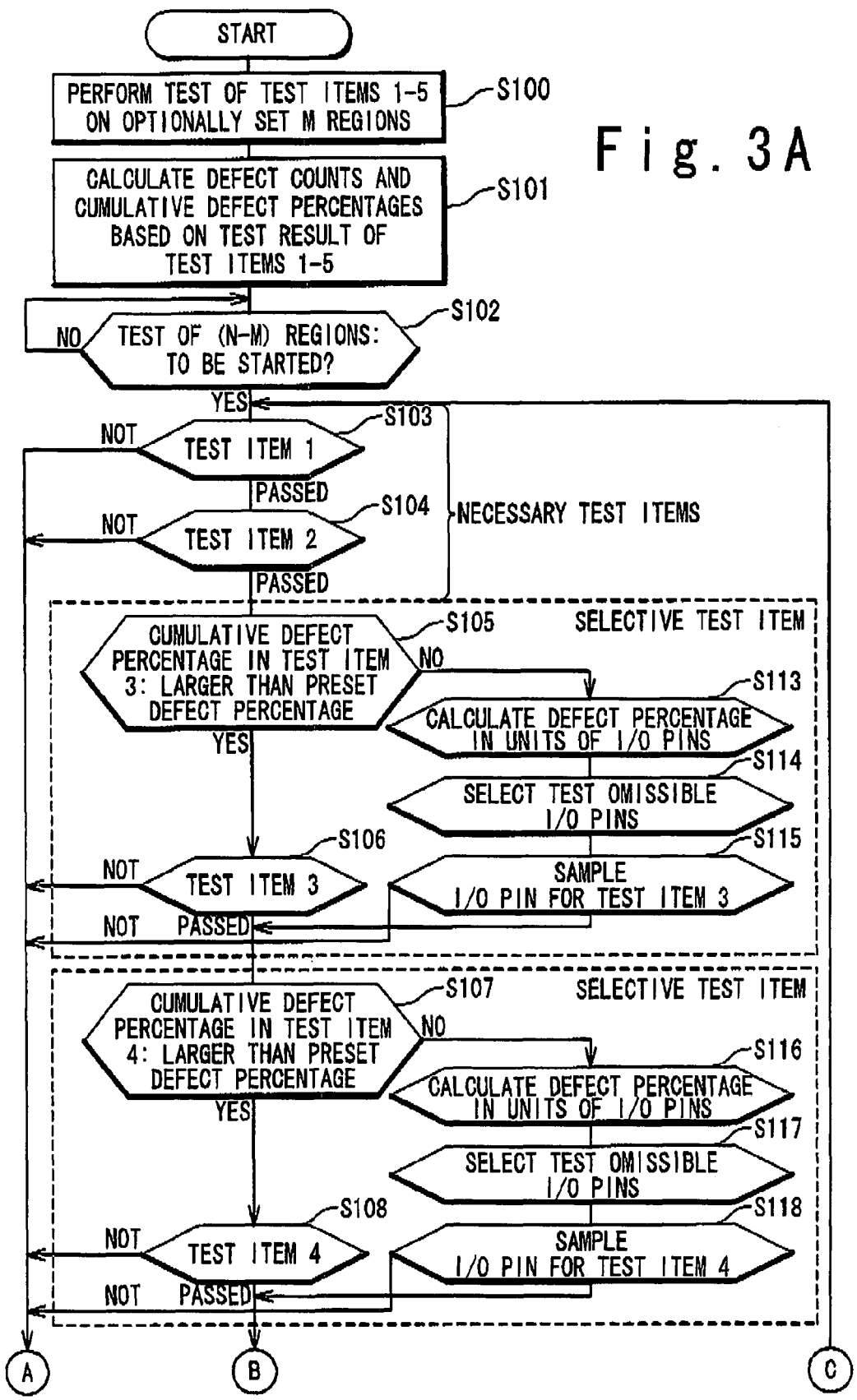
FIGS. 3A and 3B are diagrams showing a control flow of a semiconductor wafer testing method according to the first embodiment of the present invention.
Figure 3B:
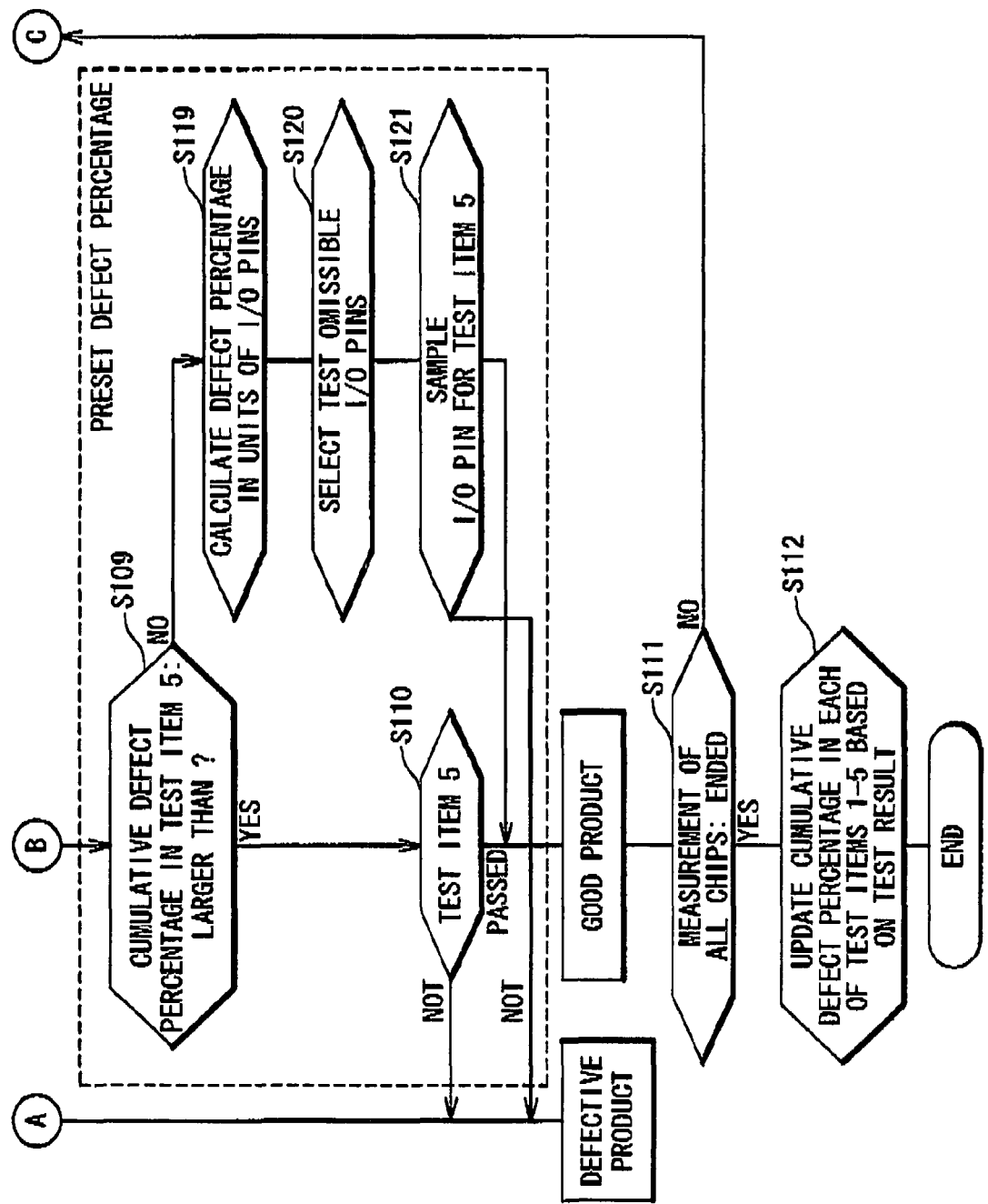

Hereinafter, referring to FIGS. 3A and 3B, the semiconductor wafer testing method according to the present embodiment will be described. When an instruction is inputted to the input unit 12 to test the semiconductor chips 22 of the semiconductor waver 20, the CPU 15 reads in and executes the semiconductor chip test program 16a which has previously stored in the storage unit 16. The whole region of the semiconductor wafer 20 is previously divided into N (N is a natural number larger than 1) regions, and an optionally predetermined number M of regions are selected from the N regions, in each of which the semiconductor chips 22 are formed. Each of the semiconductor chips has K (K is a natural number) I/O pins 18. When the semiconductor chip test program 16a is executed, the regions of the optionally predetermined number M are selected from among the N regions. A test of predetermined test items is performed on each of the K I/O pins 18. In this example, the test items are test items 1 to 5, and are such as a maximum frequency, a voltage level, and a function, in case of an audio signal of a plurality of systems and a plurality of channels (step S100) The M regions are preferably 10% to 30% of the chips of the semiconductor wafer. By performing the test of all the test items on the 10% to 30% of the chips on the semiconductor wafer, both of reduction of the test time and improvement of the test reliability can be realized.

Each test result (the number of detects and a defective percentage) at the step S100 is stored in the registers 17 or the storage unit 16 (Step S101). At the step S100, when the test on the M semiconductor chips 22 is completed, the number of defects is counted and then the cumulative defect percentage for each test item is calculated for each of the K I/O pins. The calculation results for the K I/O pins 18 are latched in the registers 17 connected to the respective I/O pins 18 or stored into the storage unit. 16 via the registers 17. Here, the cumulative defective percentage has a rate of the number of I/O pins which are determined to be defective, to the number of I/O pins tested. The cumulative defective percentage is found for every I/O pin for all of the semiconductor chips.

The test of the test items 1 to 5 as the necessary test items is not performed on the semiconductor chips 22 formed in the remaining (N−M) regions (which are not tested at the step S101) of the semiconductor wafer 20. In the following description, the test items 1 and 2 are determined to be necessary test items and the test items 3 to 5 are determined to be selected test items, based on the cumulative defect percentages.

After the completion of the test of the necessary test items on the semiconductor chips formed in the M regions, a test on the semiconductor chips formed in the remaining (N−M) regions is started (step S102). For the semiconductor chips formed in the remaining (N−M) regions, the test of the test item 1 (step S103) and the test item 2 (step S104) as the necessary test items is performed. As a test result of the test items 1 and 2, the semiconductor chip satisfying references of both the test items is determined to be a good product, and transferred to a next test step of the selected test items. The semiconductor device not satisfying the references is determined to be a defective product.

When the test of the test item 3 as the selected test item is performed, it is checked whether or not the cumulative defect percentage of the test item 3 for each I/O pin 18 which has been obtained through the tests of the M semiconductor chips and then stored in the register 17 or the storage unit 16 is higher than a preset defect percentage (step S105). If the cumulative defect percentage of the test item 3 for each I/O pin of a target semiconductor chip is higher than the preset defect percentage, the test item 3 is actually performed on each of the I/O pins 18 of the target semiconductor chip (step S106). On the other hand, if the cumulative defect percentage of the test item 3 for the target semiconductor chip is lower than the preset defect percentage, the defect percentage is calculated for each of the I/O pins 18 of the target semiconductor chip (step S113). Then, based on results of the calculation performed at the step 113, the I/O pins 18 that can be omitted from the tests are selected (step S114). For example, the I/O pin 18 with the calculated defect percentage which is not higher than a preset value is selected as a test omissible I/O pin 18. It should be noted that the I/O pin 18 to which the test is not performed may be previously specified. Next, at the step S114, the sampling test of the test item 3 is performed on the I/O pins 18 that have been determined to be not omissible (step S115). If a result of the sampling test at step S115 is good, the control flow proceeds to the next step of the test of the selected test item, i.e., test item 4. On the other hand, when the result of the sampling test at the step S115 is defective, the semiconductor chip is handled as the detective product.

When the test of the test item 4 as the selected test item is performed, it is checked whether or not the cumulative defect percentage for each I/O pin 18 which is obtained through the tests on the semiconductor chips formed in the M regions and stored in the register 17 or in the storage unit 16 is higher than a preset defect percentage (step S107). If the cumulative defect percentage of the test item 4 for the target semiconductor chip is higher than the preset defect percentage, the test of the test item 4 is actually performed on each of the I/O pins 18 of the target semiconductor chip (step S108). On the other hand, if the cumulative defect percentage of the test item 4 for the target semiconductor chip is lower than the preset defect percentage, the cumulative defect percentage is calculated for each of the I/O pins 18 of the target semiconductor chip (step S116). Then, based on results of the calculation performed at the step 116, the I/O pins 18 that can be omitted from the tests are selected (step S117). For example, the I/O pin 18 with the calculated defect percentage which is not higher than the preset defect percentage is selected as the test omissible I/O pin 18. It should be noted that the I/O pin omitted from the test may be predetermined. Next, at the step S114, the sampling test based on the test item 4 is performed for the I/O pins 18 that have been determined to be not omissible (step S118). If a result of the sampling test at the step S118 is good, the control flow proceeds to the next selected test item, i.e., test item 5. On the other hand, when the result of the sampling test at the step S118 is defective, the semiconductor chip is handled as the defective product.

When the test of the test item 5 as the selected test is performed, it is checked whether or not the cumulative defect percentage for each I/O pin 18 which has been obtained through the tests of the semiconductor chips formed in the M regions and stored in the register 17 or the storage unit 16 is higher than the preset defect percentage (step S109). If the cumulative defect percentage of the test item 5 for a target semiconductor chip is higher than the preset defect percentage, the test of the test item 5 is actually performed on each of the I/O pins 18 of the target semiconductor chip (step S110). On the other hand, if the cumulative defect percentage of the test item 5 for the target semiconductor chip is lower than the preset defect percentage, the cumulative defect percentage is calculated for each of the I/O pins 18 of the semiconductor chip (step S119). Then, based on results of the calculation performed at the step 119, the I/O pins 18 that can be omissible from the subsequent test are selected (step S120). For example, the I/O pin 18 with the calculated defect percentage which is not higher than the preset defect percentage is selected as the test omissible I/O pin 18. It should be noted that the I/O pin 18 which is not omissible may be previously specified. Next, at the step S120, a sampling test based on the test item 5 is performed for the I/O pins 18 that have been determined to be not omissible (step S121). If a result of the sampling test at the step S121 is good, the control flow proceeds to the next selected step. On the other hand, when the result of the sampling test at the step S121 is defective, the target semiconductor chip is handled as the defective product.

Then, the tests of the necessary test items and the selected test items are sequentially performed on the semiconductor chips formed in the (N−M) regions (step S111). When all the tests of the necessary test items and the selected test items on the semiconductor chips are completed, the cumulative defect percentages of the test items 1 to 5 stored in the registers 17 or the storage unit 16 are updated based on results of these tests (step S112).

As described above, in the semiconductor wafer test method according to the first embodiment, the test of the test item whose defect percentage is equal to or smaller than the specified defect percentage is not omitted for the subsequent semiconductor chips but is changed to a sampling test. That is, a predetermined number of I/O pins are tested, and thus the test item is not omitted. Moreover, in the first embodiment, a register which holds the test result is provided for each I/O pin. Omission of a test is carried out in units of I/O pins, and thus the collective omission of test items whose defect percentages are equal to or smaller than the specified defect percentages is not adopted. Moreover, in the present embodiment, based on the defect percentage of each I/O pin for each test item, it is determined whether or not the sampling test of the I/O pin is performed for other semiconductor chips. The sampling test is performed in units of chips, and thus no problem is caused even in case of the presence of manufacture variation between the plurality of chips within a wafer surface. As a result, in the first embodiment, no problem arises even when there is manufacture variation between the plurality of chips formed on the plurality of regions within the wafer surface.

Second Embodiment

Referring to FIGS. 2, 4A to 6, the semiconductor wafer testing apparatus and the semiconductor wafer testing method according to the second embodiment of the present invention will be described. Since the configuration of the semiconductor wafer testing apparatus 10 of the second embodiment is same as that of the first embodiment, the description is omitted. In the semiconductor wafer testing apparatus 10 of the second embodiment, the semiconductor chips as test targets on the semiconductor wafer 20 are grouped into a first group of semiconductor chips to which a test of all the test items is performed on the I/O pins of the semiconductor chip and a second group of semiconductor chips to which a test of all the test items is performed on a part of the I/O pins of the semiconductor chip.

The method of testing the semiconductor wafer by using the semiconductor wafer testing apparatus 10 will be described. In this method, a predetermined number of regions are selected from regions of the semiconductor wafer and semiconductor chips formed in the selected regions are selected. A test of all the test items is performed on each of the I/O pins 18 of each of the selected semiconductor chips. When the test on each of the N I/O pins 18 of each of the selected semiconductor chips is ended, a cumulative defect percentage for every test item and for each I/O pin is calculated. A test of the test item whose cumulative defect percentage to all of the N I/O pins is equal to or lower than a specific cumulative defect percentage is performed on not all of the N I/O pins 18 but a predetermined number M (M<N) of the N I/O pins 18. The number M is variable, depending on a test precise and a test time, and is equal to or more than one, but smaller than N. The number M is 10 percent of the number N of the I/O pins 18 or is determined through a statistical calculation technique. In the technique, when an current value, a voltage value and so on are monitored in case of the test on the I/O pin, a deviation of the values, a standard deviation of the values and so on are calculated. When it is determined that there is a sufficient margin to a reference, which is preset, a rate of the I/O pins to be tested is decreased. Also, it is preferable to increase the rate of the I/O pins to be tested when the good product has a value very close to the reference.

With the semiconductor wafer 20, there is large deviation in transistor characteristics such as a threshold voltage, an ON resistance, a capacitance, and a wiring resistance between the center region, an upper region and a lower region of the semiconductor wafer 20. For example, in case of 300-mm wafer, the wafer center region is distant from the wafer periphery region by about 150 mm. For this reason, if the test item is omitted as in the conventional example, there is a possibility that a defect of a semiconductor chip depending on the position of the chip is missed. On the other hand, in the present invention, the test of all of the test items which are prepared is performed on at least one of the I/O pins 18 of each of the semiconductor chips 22 in the semiconductor wafer 20.

For example, supposing that there is an interface of 64 channels which respectively correspond to the I/O pins, one channel or more are tested. The interface is arranged so that the 64 channels are arranged to be physically very close to each other. For example, in case of the semiconductor chip of 7 mm.times.7 mm, the interface is arranged in the chip. That is, the I/O pins 18 connected with the interface are also arranged to be very closed to each other. As transistors are formed in positions very close to each other, a deviation between the transistors is small. Therefore, even when the I/O pins 18 are sampling-tested, the quality of each of the semiconductor chips can be guaranteed (characteristics of the plurality of channels located in the interface of the same semiconductor chip would be almost same). Thus, the screening becomes possible through the sampling test of the I/O pins. When an output voltage of each channel in the interface is measured, erroneous determination is sometimes carried out because of variation of a measurement system such as contact resistance. When the output voltage of at least one of the channels does not satisfy a reference, the semiconductor chip is erroneously determined to be a defective product. In other words, the semiconductor chip of good quality is sometimes determined to be a defective product. Here, it cannot happen generally that the defective product is determined to be the good product. Such a problem cannot be solved by the conventional example in which the test item is omitted.

Hereinafter, referring to FIGS. 4A and 4B and FIGS. 5 and 6, the semiconductor wafer testing method in the second embodiment will be described in detail. In the following description, the test of the I/O pins 18 connected with the interface will be described as an example.

An example of test items of the I/O pin 18 at the interface is shown below.
(1) DC test: The test of DC characteristics as the test items;
  power supply current test,
  output current/voltage test,
  input/output leakage current test, and
  resistance value test,
(2) AC test: The test of AC characteristics as the test items:
  a propagation delay time test, and
  an operation frequency test.
(3) Operation test: The test of whether or not the chip operates logically normally:
  a test of whether or not the operation is right, by using a test pattern,
  a power supply voltage margin test, and
  a speed test.

In this embodiment, the above test items are prepared, and the test target is 64 I/O pins 18 respectively connected with the 64 channels of the interface. In this embodiment, there are selected semiconductor chips 22A, on whose I/O pins a test of all the test items is performed, and semiconductor chips 22B, wherein the test of all the test items is performed, on the I/O pins of the semiconductor chips 22B of a predetermined number smaller than 64 and a predetermined kind of I/O pins.

Figure 5:
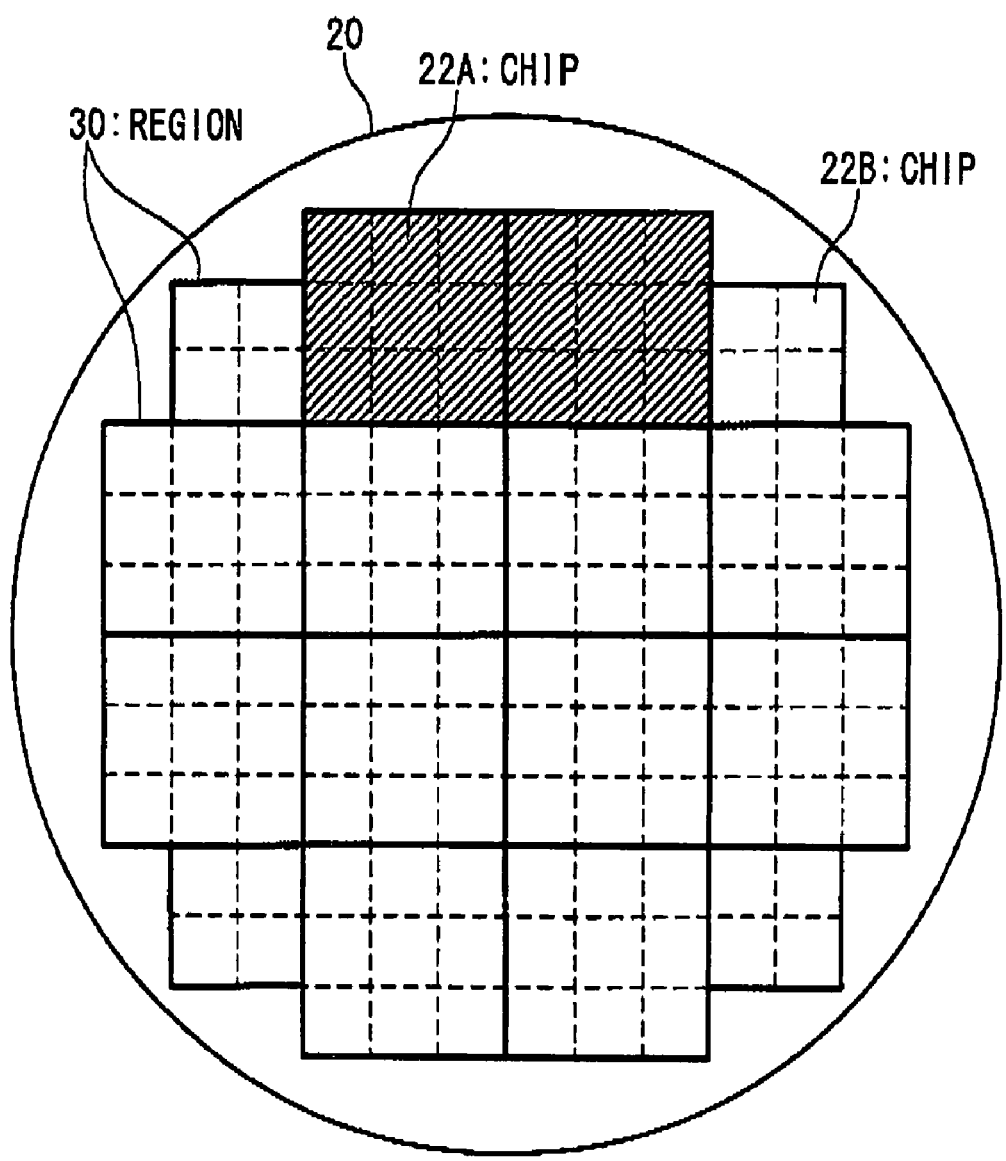
FIG. 5 is a diagram showing an example of arrangement of semiconductor chips 22A that all of I/O pins are tested and semiconductor chips 22B that I/O pin of a predetermined number are tested in the semiconductor wafer.
Figure 6:
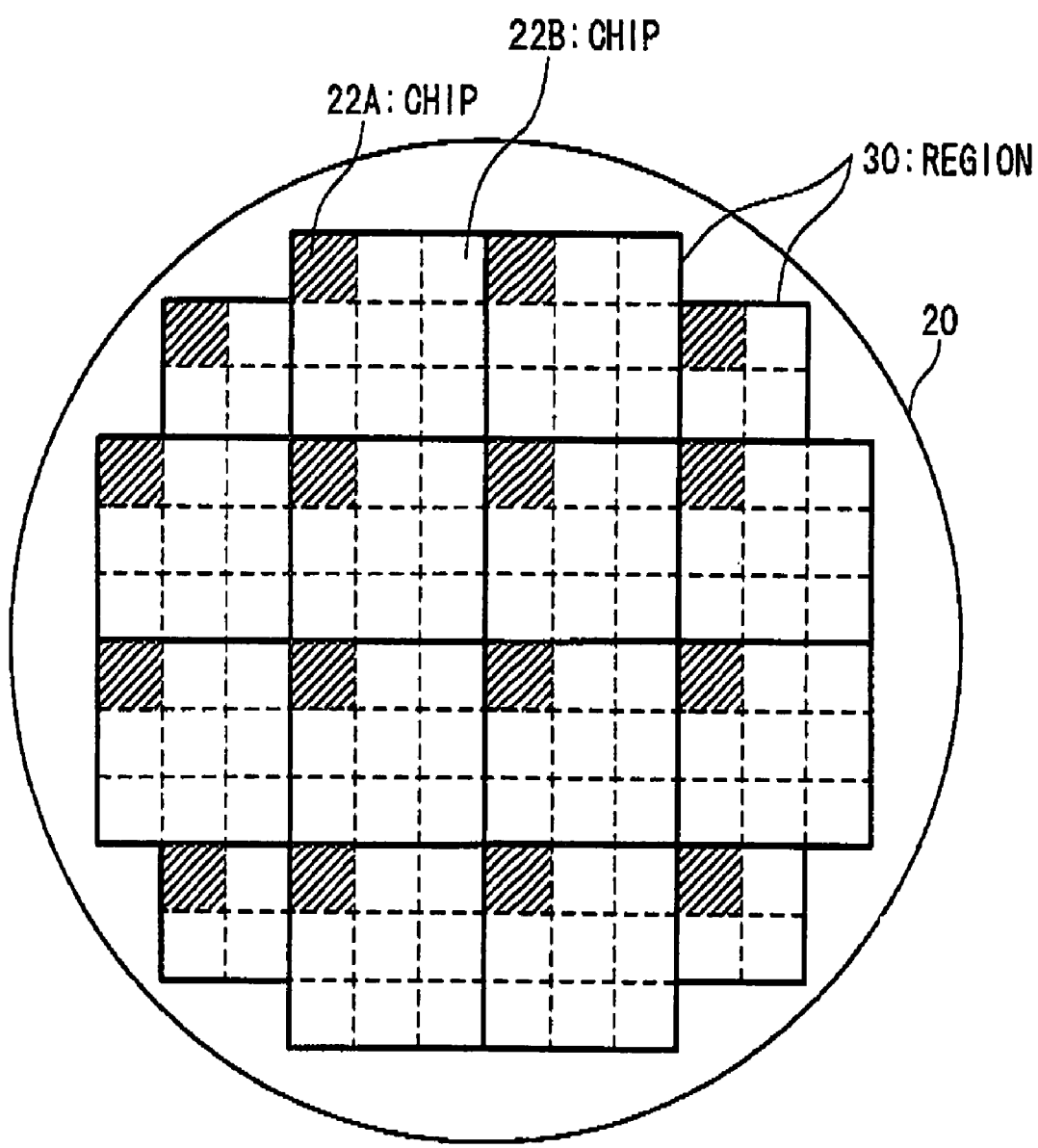
FIG. 6 is a diagram showing another example of arrangement of semiconductor chips 22A and semiconductor chips 22B.

An example of arrangement of the semiconductor chips 22A that all the I/O pins are tested and the semiconductor chips 22B that the I/O pin of the predetermined number are tested in the semiconductor wafer 20 is shown in FIGS. 5 and 6. Here, the semiconductor wafer 20 is divided into N (N is a natural number larger than 1) regions 30 in a same process, e.g., in a same pattern forming process, and each of the N regions 30 includes K (K is a natural number) semiconductor chips 22. It should be noted that the numbers of the semiconductor chips 22 in the respective regions 30 are not always equal to each other, due to the arrangement state of the semiconductor chips in the periphery of the semiconductor wafer 20. That is, the number K of the semiconductor chips 22 in each of the N regions 30 may be a same number or a different number. In this example, the semiconductor wafer 20 has the 16 (=N) region 30, and the 9 (=K) or 4 (=K) semiconductor chips 22 are formed in each region 30. In this embodiment, M regions are selected from the N regions (1.ltoreq.M.ltoreq.N), and a predetermined number J of the semiconductor chips (1.ltoreq.J.ltoreq.K) formed in each of the M regions are selected as the semiconductor chips 22A. The remaining semiconductor chips are the semiconductor chips 22B.

In an example shown in FIG. 5, all the semiconductor chips 22 formed in the M regions 30 are selected as the semiconductor chips 22A whose I/O pins are tested. All the semiconductor chips 22 formed in the (N−M) region 30 are selected as the semiconductor chips 22B, in each of which a predetermined number of the I/O pins are tested. That is, in the example shown in FIG. 5, the test is performed on all the I/O pins in each of the K semiconductor chips 22A formed in each of the M selected regions. Then, a sampling test is performed on the sampled I/O pins of each of the semiconductor chips 22B formed in the (N−M) non-selected regions. Here, all of the 18 (=2×9) I/O pins of the semiconductor chips formed in the two selected regions 30 are tested. A part of I/O pins of each of the 106 semiconductor chips 22B is tested (M=2, J=K=9).

According to the example shown in FIG. 5, a group of the semiconductor chips 22A in which all the I/O pins are tested, and a group of the semiconductor chips 22B in which a sampled part of the I/O pins is tested is collectively arranged in positions. Thus, a test time can be reduced.

In an example shown in FIG. 6, in each of all the regions 30 of the semiconductor wafer 20, the semiconductor chips 22 of a predetermined number J are selected as the semiconductor chips 22A and a test is performed on all the I/O pins of each of the semiconductor chips 22A. The remaining semiconductor chips are selected as the semiconductor chip 22B in which the I/O pins of a predetermined number are tested (M=N, 1.ltoreq.J.ltoreq.K). Here, the semiconductor chip 22 formed a predetermined position of each region 30 is selected as the semiconductor chip 22A and is tested (M=N=16 and J−1).

According to the example shown in FIG. 6, the test of the I/O pins can be performed in consideration of a distribution of the semiconductor chips 22 in the semiconductor wafer 20. For this reason, manufacture variation in the forming position of the semiconductor chip 22 of the semiconductor wafer 20 can be tested statistically.

If a part of the semiconductor chips 22 formed in the semiconductor wafer 20 is selected as the semiconductor chips 22, the method of selecting the semiconductor chips 22A is not limited to the above. Also, it is preferable that 10 to 30 percents of the whole semiconductor chips formed in the semiconductor wafers 20 are selected as the semiconductor chips 22A.

Figure 4A:
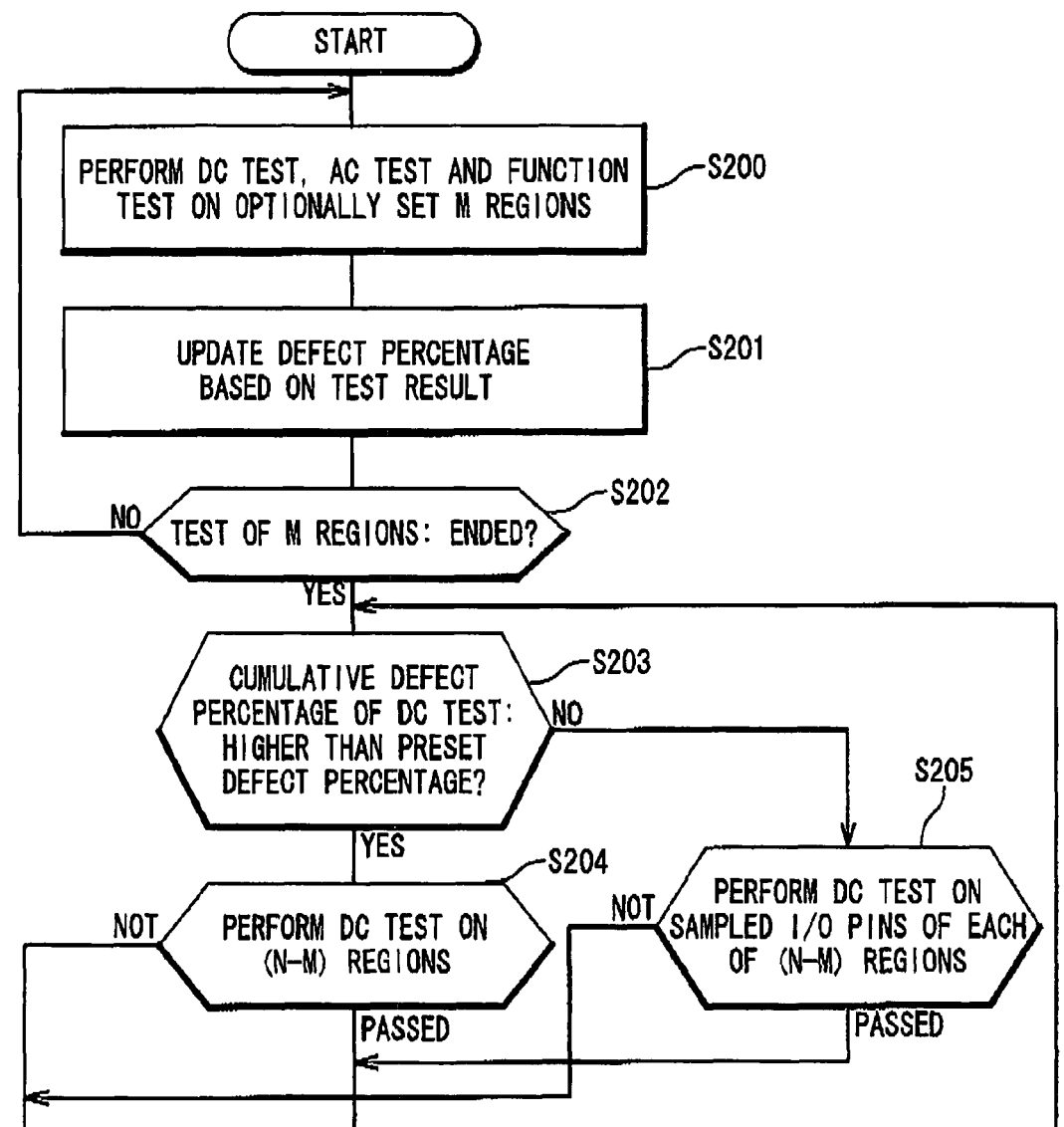
FIGS. 4A and 4B are diagrams showing a control flow of the semiconductor wafer testing method according to a second embodiment of the present invention.
Figure 4B:
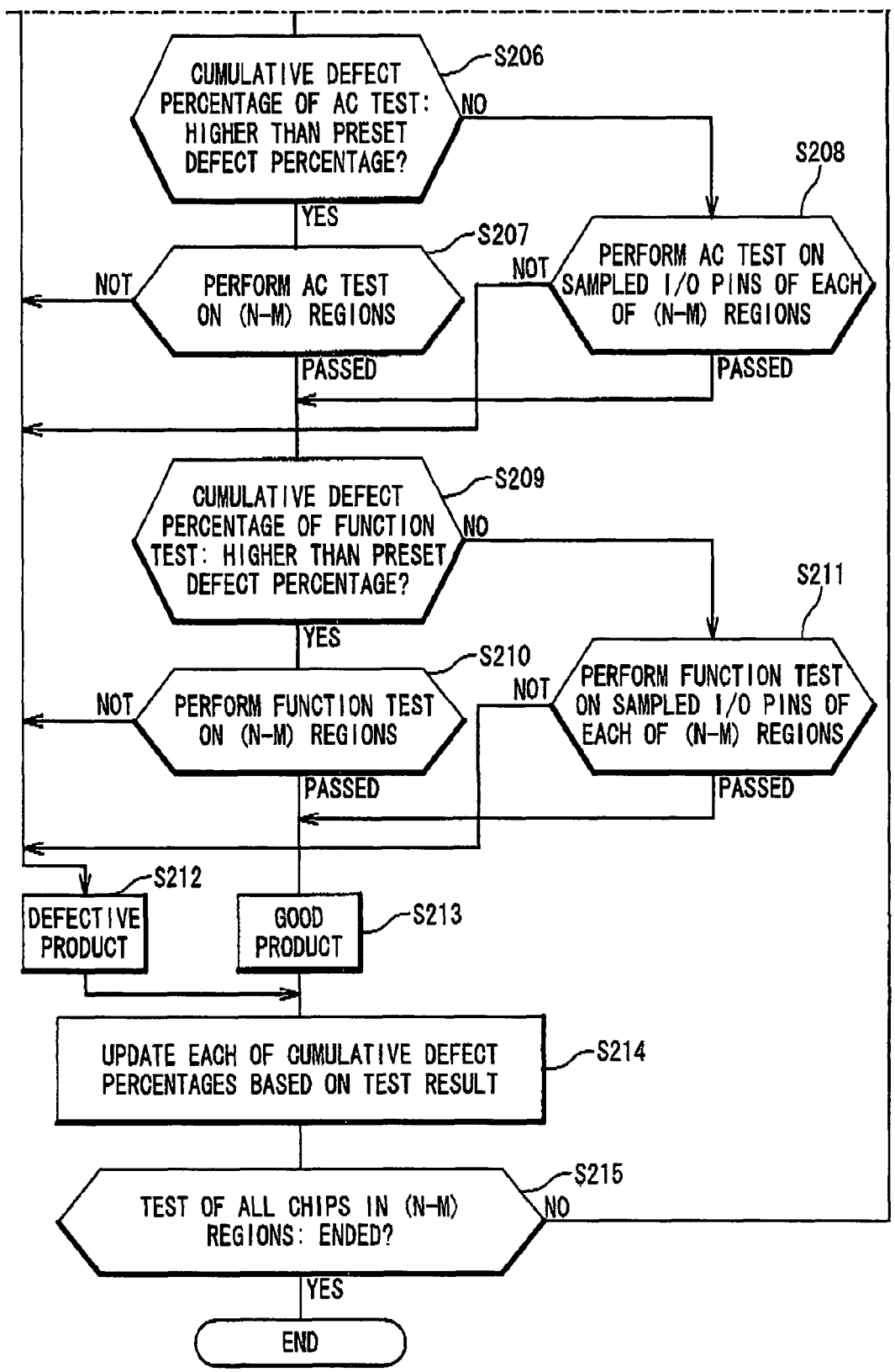

Referring to FIGS. 4A and 4B, the operation of the semiconductor wafer testing apparatus 10 according to the second embodiment of the present invention will be described. Like the first embodiment, a test of the DC test, the AC tests, and the functional test which are previously prepared as the test items is performed on all the I/O pins 18, i.e., the 64 I/O pins 18 connected with the interface in each of the J semiconductor chips 22A formed in the M selected regions (Step S200).

Next, like the step S101 of the first embodiment, the test results at the step S200, i.e., the numbers of defects and the defect percentages are stored in the registers 17 or the storage unit 16 (Step 5201). In this case, when the cumulative defect percentages are already stored, the cumulative defect percentages are updated. The operation of the steps S200 and S201 is repeated until all the test, i.e., the DC test, the AC test, and the functional test of all the semiconductor chips 22A in the M regions are completed (Step S202).

When all the semiconductor chips 22a of the M regions are tested, the cumulative defect percentage of the DC test for every I/O pin 18 at the present time and a preset defect percentage are compared (Step S203). When any I/O pin exists in which the cumulative defect percentage is higher than the preset defect percentage at a step S203, the DC test is performed on all of the I/O pins of the semiconductor chips 223 formed in the (N−M) non-selected regions (Step S204). When there is any I/O pin 18 which does not pass the test at the step S204, the semiconductor chip is determined as a defective product (Step S212). Based on the test result, the cumulative defect percentage for every I/O pin 18 is updated (Step S214). In this example, the cumulative defect percentage corresponding to the I/O pin 18 determined to be defective increases, and besides, the cumulative defect percentages of the non-defective I/O pins decrease.

On the other hand, at the step S203, when the cumulative defect percentages of all I/O pins 18 are lower than the preset defect percentages, the DC test is performed on a part of the I/O pins of the semiconductor chips 22B formed in the (N−M) non-selected regions, i.e., the I/O pins of a predetermined number (Step S205). When any I/O pin 18 subjected to the DC test is determined to be defective at the step S205, the semiconductor chip 22b is determined as the defective product (Step S212). The cumulative defect percentage corresponding to the I/O pin 18 is updated (Step S214). In this case, the cumulative defect percentage corresponding to the I/O pin 18 determined to be defective increases. The cumulative defect percentages corresponding to the other I/O pins 18 are not updated.

In case of the semiconductor chip passing the test at the step S204 or step S205, i.e., when there is no I/O pin 18 determined to be defective in the DC test, the control flow advances to the following AC test.

In the beginning of the AC test, the cumulative defect percentage of the AC test for every I/O pin 18 at the present time and a preset defect percentage are compared. (Step S206). At the step S206, when the I/O pin exists in which the cumulative defect percentage is higher than the preset defect percentage, the AC test is performed to all of the I/O pins of the semiconductor chips 22B formed in the 8 N−M) non-selected regions (Step S207). At the step S207, when there is an I/O pin 18 determined to be defective, the semiconductor chip is determined as the defective product (Step S212). Based on the test result, the cumulative defect percentage for every I/O pin 18 is updated (Step S214). In this example, the cumulative defect percentage corresponding to the I/O pin 18 determined to be defective is increased and besides, the cumulative defect percentages of the I/O pins determined to be good are decreased.

On the other hand, at the step S206, when the cumulative defect percentages of all I/O pins 18 are lower than the preset defect percentages, the AC test is performed on a part of the I/O pins 18 of the semiconductor chips 22B formed in the (N−M) non-selected regions, i.e., the I/O pins 18 of a predetermined number (step S208). When any I/O pin subjected to the AC test is determined to be defective at the step S208, the semiconductor chip is determined to be the defective product (Step S212). The cumulative defect percentage corresponding to the I/O pin 18 is updated (Step S214). In this case, the cumulative defect percentage corresponding to the I/O pin 18 determined to be defective is updated to increase, and the cumulative defect percentages corresponding to the other I/O pins 18 are not updated.

In case of the semiconductor chips passing the tests at the step S207 or step S208, i.e. when there is no I/O pin 18 determined to be defective in the AC test, the control flow advances to the following functional test.

In case of beginning of the functional test, the cumulative defect percentage of the functional test for every I/O pin 18 at the present time and a preset defect percentage are compared (Step S209). At the step S209, when the I/O pin exists which the cumulative defect percentage is higher than the preset defect percentage, the functional test is performed on all of the I/O pins of the semiconductor chips 22B formed in the (N−M) non-selected regions (Step S210). When there is any I/O pin 18 determined to be defective at the step S210, the semiconductor chip is determined as a defective product (Step S212). Based on the test result, the cumulative defect percentage for every I/O pin 18 is updated (Step S214). In this example, the cumulative defect percentage corresponding to the I/O pin 18 determined to be defective increases. Besides, the cumulative defect percentages of the I/O pins determined to be good is updated to decrease.

On the other hand, at the step S209, when the cumulative defect percentages of all I/O pins 18 are lower than the preset defect percentages, the functional test is performed to a part of the I/O pins of the semiconductor chips 22B formed in the (N−M) non-selected regions, i.e., the I/O pins of a predetermined number (Step S208). When any I/O pin 18 subjected to the functional test at the step S208 is determined to be defective, the semiconductor chip is determined as the defective product (Step S212). The cumulative defect percentage corresponding to the I/O pin 18 is updated (Step S214). In this case, the cumulative defect percentage corresponding to the I/O pin 18 determined to be defective increases. The cumulative defect percentages corresponding to the other I/O pins 18 are not updated.

In case of the semiconductor chips passing the tests at the step S210 or step S211, i.e., when there is no I/O pin 18 determined to be defective in the functional test, the semiconductor chip is determined as the good product (Step S213). Based on the test result, the cumulative defect percentage for every I/O pin 18 is updated (Step S214). In this case, the cumulative defect percentage for every I/O pin 18 and for each test items is updated to decrease.

The operation from the step S203 to the step S214 is repeated until the test of all the test items (the DC test, the AC test, and the functional test) on all the semiconductor chips 22B formed in the (N−M) non-selected regions is completed (Step S215). It should be noted that the order of the above-mentioned DC test, the AC test, and the functional test is not limited to this.

The number and the kind of the I/O pins to be tested in the semiconductor chip 22B are determined in accordance with the kind of the I/O pin, the kind of the test, and the standards of the testing apparatus. Depending on the kind of the I/O pin, the kind of the test, and the standards of the testing apparatus, there are a case that a plurality of I/O pins (for example, 10 I/O pins) are tested at a same time and a case that each of the I/O pins is separately tested. Therefore, the number of the I/O pins 18 to be tested at above-mentioned steps S205, S208, and S211 (the test of the sampled I/O pins) is determined based on the test item. When it is possible to test the plurality of I/O pins at the same time, the same test time is necessary even for the test of one of the plurality of I/O pins and even for the test of some of the plurality of I/O pins. Therefore, all the plurality of I/O pins may be tested. Thus, while improving the test precision, the decrease of the test time can be attained. However, when the I/O pin must be separately tested one by one in the other test item, it is preferable that one of the I/O pins 18 is sampled and selected. Thus, the test of all the test items can be performed and the test time can be decreased, compared with a case that the plurality of I/O pins are tested.

Moreover, the number and the kind of the I/O pins to be sampled and tested that an I/O pin pilferage is tested may be determined in accordance with the cumulative defect percentages or for every test items, like the first embodiment.

As described above, in the semiconductor wafer testing apparatus according to the present invention, the semiconductor chips of the wafer are grouped into the semiconductor chips whose I/O pins are tested and the semiconductor chips, a part of whose I/O pins is tested. In this case, it is preferable that the I/O pins are sampled and the test of all the test items is performed on the sampled I/O pins. Thus, it is possible to decrease the test time while maintaining the reliability of the test.

The present embodiment can provide a semiconductor wafer testing apparatus and a semiconductor wafer testing method.

As described above, the embodiments of the present invention have been described, but the configuration is not limited to the above embodiments. A change and a modification not apart from sprits of the present invention are contained in the present invention.

What is claimed is:

1. A method of testing a semiconductor wafer using a semiconductor chip test program stored in a storage unit of a semiconductor wafer testing apparatus, the method comprising:
    selecting a predetermined number of semiconductor chips from among a plurality of semiconductor chips formed on a semiconductor wafer using said semiconductor wafer testing apparatus;
    performing a first test on I/O pins of each of said selected semiconductor chips using said semiconductor wafer testing apparatus; and
    performing a second test on a part of said I/O pins of each one of the non-selected semiconductor chips using said semiconductor wafer testing apparatus,
    wherein said semiconductor wafer is divided into n regions, wherein n is a natural number more than 1, and said plurality semiconductor chips are formed in said n regions, said selecting comprises:
        selecting m regions from said n regions, wherein m is a natural number smaller than n; and
        selecting semiconductor chips from each of said selected m regions as said semiconductor chips of the predetermined number, and
    said J semiconductor chips are in a range of 0.1 to 0.3% of said plurality of semiconductor chips.

2. The method according to claim 1, wherein said performing a first test includes performing said first test of test items on said I/O pins of each of said selected semiconductor chips, and said performing a second test includes performing said second test of said test items on the I/O pins of each one of said non-selected semiconductor chips.

3. The method according to claim 1, wherein said semiconductor wafer is divided into n regions, wherein n is a natural number more than 1, and said plurality semiconductor chips are formed in said n regions, said selecting comprises:
    selecting m regions from said n regions, wherein m is a natural number smaller than n; and
    selecting J semiconductor chips from said selected m regions, wherein J is a natural number.

4. A method of testing a semiconductor wafer using a semiconductor chip test program stored in a storage unit of a semiconductor wafer testing apparatus, comprising:
    selecting a predetermined number of semiconductor chips from among a plurality of semiconductor chips formed on a semiconductor wafer using said semiconductor wafer testing apparatus;
    performing a first test on I/O pins of each of said selected semiconductor chips using said semiconductor wafer testing apparatus;
    performing a second test on a part of said I/O pins of each one of non-selected semiconductor chips using said semiconductor wafer testing apparatus; and
    calculating a cumulative defect percentage for each of said test items of said first test using said semiconductor wafer testing apparatus,
    wherein said performing a second test comprises performing said second test on the I/O pins for each one of said non-selected semiconductor chips when said cumulative defect percentage is not higher than a preset defect percentage, and
    wherein said semiconductor wafer is divided into n regions, wherein n is a natural number more than 1, and said plurality semiconductor chips are formed in said n regions, said selecting comprises:
        selecting m regions from said n regions, wherein m is a natural number smaller than n; and
        selecting semiconductor chips from each of said selected m regions as said semiconductor chips of the predetermined number.

5. A semiconductor wafer testing apparatus which tests semiconductor chips formed in regions of a semiconductor wafer, comprising:
    a CPU;
    a storage unit configured to store a semiconductor chip test program; and
    a communication unit configured to receive and hold a data signal sent from each of said semiconductor chips,
    wherein said CPU reads out and executes said semiconductor chip test program from said storage unit, and
    said CPU, based on said semiconductor chip test program:
        selects semiconductor chips from a plurality of semiconductor chips formed in divided regions of said semiconductor wafer;
        performs a first test of test items on each of said selected semiconductor chips;
        performs a second test of necessary ones of the test items on each of non-selected semiconductor chips, said test items containing said necessary test items and selected test items;
        compares a cumulative defect percentage of each of said selected test items with a preset defect percentage;
        determines whether a third test of said selected test items should be performed on each of said non-selected semiconductor chips, based on the comparing result;
        when said cumulative defect percentage of said selected test items is higher than said preset defect percentage, performs said third test of said test items on each of said non-selected semiconductor chips, and
        when said cumulative defect percentage of said selected test items is not higher than said preset defect percentage, calculates a pin defect percentage for each of the I/O pins of each of said non-selected semiconductor chips; and selects test omissible I/O pins of each of said non-selected semiconductor chips based on said defect percentage, performs said third test of said selected test items on a remaining I/O pin as at least one of said I/O pins other than said test omissible I/O pins in each of said non-selected semiconductor chips, and updates said cumulative defect percentage for each of said selected test items and for the remaining I/O pin.

* * * * *